(12) United States Patent
Chen et al.

(10) Patent No.: US 11,460,619 B2
(45) Date of Patent: Oct. 4, 2022

(54) POLARIZER, DISPLAY PANEL AND DISPLAY DEVICE

(71) Applicant: WUHAN TIANMA MICRO-ELECTRONICS CO., LTD., Wuhan (CN)

(72) Inventors: Xian Chen, Wuhan (CN); Lijing Han, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 799 days.

(21) Appl. No.: 16/255,818

(22) Filed: Jan. 24, 2019

(65) Prior Publication Data
US 2020/0103574 A1 Apr. 2, 2020

(30) Foreign Application Priority Data

Sep. 28, 2018 (CN) .......................... 201811137624.2

(51) Int. Cl.
*G02B 5/30* (2006.01)
*C09J 7/38* (2018.01)
(Continued)

(52) U.S. Cl.
CPC .............. *G02B 5/3041* (2013.01); *C09J 7/38* (2018.01); *G02F 1/133528* (2013.01); *H01L 51/5281* (2013.01); *G02F 2202/28* (2013.01)

(58) Field of Classification Search
CPC ........ G02B 1/04; G02B 5/3033; G02B 1/105; G02B 1/14; G02B 5/3083; G02B 5/30; G02B 5/3025; G02B 1/111; G02B 5/3041; G02B 27/283; G02B 27/286; G02B 5/3016; G02B 5/305; G02B 1/02; G02B 1/043;
(Continued)

(56) References Cited

FOREIGN PATENT DOCUMENTS

| CN | 102662302 A | 9/2012 |
|---|---|---|
| CN | 104345373 A | 2/2015 |

(Continued)

OTHER PUBLICATIONS

Office Action of Chinese Patent Application No. 201811137624.2 dated Jul. 20, 2020.
(Continued)

*Primary Examiner* — Collin X Beatty
*Assistant Examiner* — Grant A Gagnon
(74) *Attorney, Agent, or Firm* — Kilpatrick Townsend & Stockton, LLP

(57) ABSTRACT

A polarizer, a display panel and a display device including the polarizer are provided. The polarizer includes: a first polarizing layer, a first protective film and a first pressure-sensitive adhesive layer. The first polarizing layer includes a first hollow portion and a first polarizing portion surrounding the first hollow portion. The first protective film covers the first hollow portion and the first polarizing portion. The first pressure-sensitive adhesive layer is located at a side of the first polarizing layer facing away from the first protective film. With the display panel and the display device including the polarizer, since the first hollow portion is disposed in the first polarizing portion, an image collecting device such as a camera can be disposed in the polarizing region, thereby improving utilization of the surface area of the polarizer provided by the embodiments of the disclosure, and increasing the screen-to-body ratio.

13 Claims, 15 Drawing Sheets

(51) Int. Cl.
*G02F 1/1335* (2006.01)
*H01L 51/52* (2006.01)

(58) Field of Classification Search
CPC ...... G02B 5/02; G02B 5/0278; G02B 5/3058; G02B 1/10; G02B 2027/0112; G02B 21/14; G02B 27/0006; G02B 27/0101; G02B 27/0172; G02B 5/0221; G02B 5/0242; G02B 5/208; G02B 5/32; G02B 19/0028; G02B 19/0057; G02B 1/007; G02B 1/08; G02B 1/11; G02B 1/118; G02B 1/12; G02B 1/16; G02B 1/18; G02B 2027/011; G02B 2027/012; G02B 2027/0125; G02B 2027/0138; G02B 2027/0174; G02B 2027/0178; G02B 21/0032; G02B 2207/101; G02B 23/08; G02B 23/105; G02B 26/123; G02B 27/0081; G02B 27/01; G02B 27/0103; G02B 27/0905; G02B 27/0927; G02B 27/0944; G02B 27/0988; G02B 27/1046; G02B 27/14; G02B 27/142; G02B 27/145; G02B 27/28; G02B 27/281; G02B 27/285; G02B 27/48; G02B 27/52; G02B 27/58; G02B 30/25; G02B 30/27; G02B 3/00; G02B 3/005; G02B 5/008; G02B 5/0215; G02B 5/0284; G02B 5/04; G02B 5/045; G02B 5/223; G02B 5/3008; G02B 5/3075; G02B 6/00; G02B 6/0053; G02B 6/0065; G02B 6/1226; G02B 6/2726; G02B 6/2793; G02B 6/29397; G02B 6/32; G02B 6/4203; G02B 6/4206; G02B 6/4208; G02B 6/4275; G02B 6/4296; G02F 1/133528; G02F 2201/50; G02F 1/133634; G02F 2202/28; G02F 1/133607; G02F 2202/40; G02F 1/133308; G02F 1/133311; G02F 1/133531; G02F 1/13363; G02F 1/133635; G02F 2413/12; G02F 1/0136; G02F 1/0147; G02F 1/1303; G02F 1/133302; G02F 1/133305; G02F 1/13332; G02F 1/133325; G02F 1/133331; G02F 1/133357; G02F 1/133502; G02F 1/133504; G02F 1/133507; G02F 1/133526; G02F 1/133533; G02F 1/133536; G02F 1/133541; G02F 1/133548; G02F 1/133608; G02F 1/13362; G02F 1/133637; G02F 1/134363; G02F 1/13439; G02F 1/1393; G02F 1/1396; G02F 2202/023; G02F 2202/025; G02F 2202/22; G02F 2413/03; G02F 2413/04; G02F 2413/08; G02F 2413/105; C09J 133/066; C09J 133/06; C09J 133/08; C09J 2301/302; C09J 175/04; C09J 175/12; C09J 2301/312; C09J 2433/006; C09J 4/00; C09J 7/385; H01L 27/3244; H01L 51/5206; H01L 51/5212; H01L 51/5253; H01L 51/5259; H01L 51/5281; H01L 51/5293
USPC .......................................................... 359/485
See application file for complete search history.

(56) References Cited

FOREIGN PATENT DOCUMENTS

| | | |
|---|---|---|
| CN | 107248374 A | 10/2017 |
| CN | 107395928 A | 11/2017 |
| CN | 108319069 A | 7/2018 |

OTHER PUBLICATIONS

Office Action of Chinese Patent Application No. 201811137624.2 dated May 17, 2021.

M1　　　　　　M2　　　　　　M0

M1　　　　　　M2　　　　　　M0

US 11,460,619 B2

POLARIZER, DISPLAY PANEL AND DISPLAY DEVICE

CROSS-REFERENCE TO RELATED APPLICATIONS

The present disclosure claims priority to Chinese Patent Application No. 201811137624.2, filed on Sep. 28, 2018, the content of which is incorporated herein by reference in its entirety.

FIELD

The present disclosure relates to the field of display technologies, and particularly, to a polarizer, a display panel and a display device.

BACKGROUND

In existing display device technology, a display panel is mainly classified into a liquid crystal display panel and an organic light-emitting display panel. In the liquid crystal display panel, an electric field capable of controlling deflection of liquid crystal molecules can be formed by applying a voltage to a pixel electrode and a common electrode, thereby controlling light transmission to realize display function of the liquid crystal display panel. In the organic light-emitting display panel, an organic electroluminescent material is used to emit light when an electric current passes through the organic electroluminescent material, thereby realizing display function of the organic light-emitting display panel.

With application of display technology in smart wear and other portable electronic devices, the design of electronic products is constantly pursuing a smooth user experience. Meanwhile, it is increasingly pursuing thinner and lighter, larger display area ratio and more functions. At present, a large number of products of "fringe-type" mobile phone appear, but area of "fringe" still occupies a large proportion of the entire display device, and the regions surrounding the camera and the receiver have not been utilized to the utmost extent.

In addition, the polarizer in the related art is disposed in the entire surface, which does not cooperate with the "fringe" design of the display panel, since it is required to be excavated to turn into a profiled polarizer, which not only increases the technology processes, but also is not conducive to protect the polarizer.

SUMMARY

The present disclosure provides a polarizer, a display panel and a display device which can provide a non-polarizing region in a polarizing region to meet the requirements for higher screen utilization of the display panel and the display device, and can protect the polarizer more effectively.

In one embodiment of the present disclosure, a polarizer is provided. The polarizer includes a first polarizing layer including a first hollow portion and a first polarizing portion surrounding the first hollow portion; a first protective film covering the first hollow portion and the first polarizing portion; and a first pressure-sensitive adhesive layer located at a side of the first polarizing layer facing away from the first protective film.

In another embodiment of the present disclosure, a display panel is provided. The display panel includes a display substrate and a polarizer. The display substrate includes: a first underlay including a plurality of gate lines, a plurality of data lines, and a plurality of pixel units; and a second underlay disposed opposite to the first underlay. The display substrate has a hollow region and a display region surrounding the hollow region, and none of the plurality of pixel units is arranged in the hollow region. The polarizer includes: a first polarizing layer including a first hollow portion and a first polarizing portion surrounding the first hollow portion; a first protective film covering the first hollow portion and the first polarizing portion; and a first pressure-sensitive adhesive layer located at a side of the first polarizing layer facing away from the first protective film. The first hollow portion overlaps with the hollow region.

In another embodiment of the present disclosure, a display device is provided. The display device includes any display panel as provided by the present disclosure.

BRIEF DESCRIPTION OF DRAWINGS

Embodiments of the present disclosure are illustrated by, the accompanying drawings which are briefly described below. The drawings described below are merely a part of the embodiments of the present disclosure.

DESCRIPTION OF EMBODIMENTS

Embodiments of the present disclosure are clearly described in details with reference to the accompanying drawings. The described embodiments are merely part of the embodiments of the present disclosure rather than all of the embodiments.

The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects before and after the "/" is an "or" relation.

It should be understood that although the terms 'first', 'second' and 'third' may be used in the present disclosure to describe a hollow portion, a pressure-sensitive adhesive layer, an underlay, and an alignment mark, etc., however, the hollow portion, the pressure-sensitive adhesive layer, the underlay, and the alignment mark, etc. should not be limited to these terms.

These terms are used only to distinguish them from one another. For example, without departing from the scope of the embodiments of the present disclosure, a first hollow portion, a first pressure-sensitive adhesive layer, a first underlay, and a first alignment marker may also be referred to as a second hollow portion, a second pressure-sensitive adhesive layer, a second underlay, and a second alignment mark. Similarly, the second hollow portion, the second pressure-sensitive adhesive layer, the second underlay and the second alignment marker may also be referred to as the first pressure-sensitive adhesive layer, the first underlay, and the first alignment mark.

Figure 1:
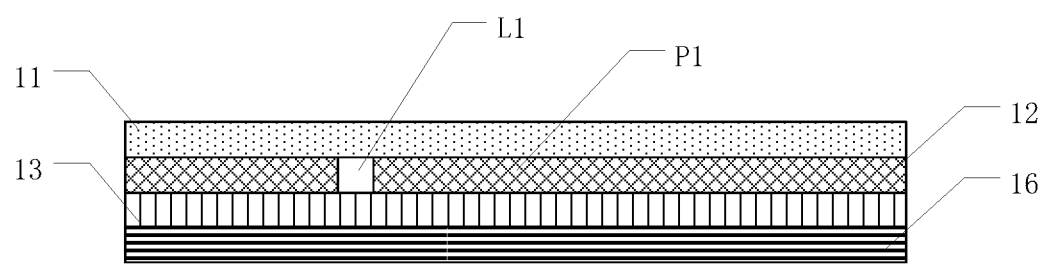
FIG. 1 is a hierarchical schematic diagram showing a polarizer according to an embodiment of the present disclosure.
Figure 2:
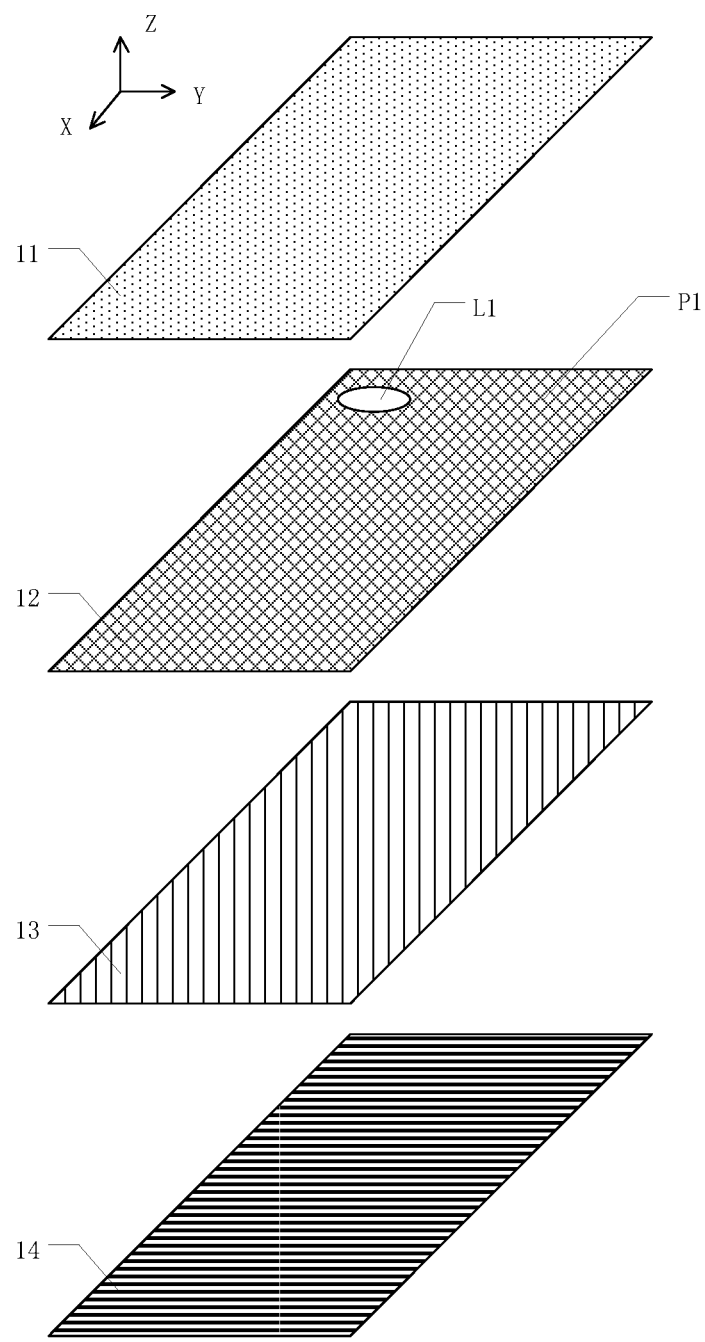
FIG. 2 is an exploded view of the polarizer shown in FIG. 1.

The embodiments of the present disclosure provide a polarizer 10. As shown in FIGS. 1 and 2, the polarizer 10 includes a first protective film 11, a first polarizing layer 12, a first pressure-sensitive adhesive layer 13, and a release film 16. The first polarizing layer 11 includes a first hollow portion L1 and a first polarizing portion P1 surrounding the first hollow portion. The first protective film 11 covers the first hollow portion L1 and the first polarizing portion P1. The first pressure-sensitive adhesive layer 13 is located at a side of the first polarizing layer 12 facing away from the first protective film 11. The release film 16 is located at a side of the first pressure-sensitive adhesive layer 13 facing away from the first polarizing layer 12.

The first protective film 11 may be a protective film, a reflective film, or a transflective film, and is mainly used to protect the first polarizing layer 12, or may be combined with other functions according to application of the polarizer 10. The first protective film 11 covers the first hollow portion L1 and the first polarizing portion P1, that is, the entire surface of the first protective film 11 is disposed on the first polarizing layer 12. Therefore the edge of the first hollow portion L1 can be protected to avoid the polarizing portion P1 from being damaged by the edge of the first hollow portion L1.

The first pressure-sensitive adhesive layer 13 may be a high-temperature moisture-proof pressure-sensitive adhesive, and its main components may be acrylate and acrylate polymer. The first pressure-sensitive adhesive layer 13 has good hydrophobicity and heat resistance. The release film 16 mainly serves to protect the polarizer 10 during transportation of the polarizer 10, and is peeled off the release film 16 when the polarizer 10 is attached.

Referring to FIGS. 1 and 2, the polarizer 10 provided in the embodiments of the present disclosure may be required to manufacture the first polarizing portion P1 and the first hollow portion L1 on the first polarizing layer 12. Firstly, a substrate or an organic film is provided. The first hollow portion L1 is then shielded by using a mask, and a liquid crystal (LC) material is coated on the substrate or the organic film while the liquid crystal material will not be applied to the first hollow portion L1. Next, the substrate or the organic film coated with the liquid crystal material is radiated by light so as to orient the liquid crystal in a specific axial direction. Next, the oriented liquid crystal is cured to form a required liquid crystal polyvinyl alcohol (LC PVA) film layer, and then the first polarizing layer 12 is formed. Then, the first polarizing layer 12 is attached to the first protective film 11, the first pressure-sensitive adhesive layer 13, and the release film 16.

With the polarizer 10 according to the embodiments of the present disclosure, since the first hollow portion L1 is disposed within the first polarizing portion P1, the first hollow portion L1 does not polarize the light, so that an image collecting device such as a camera can be disposed in the polarizing region, thereby improving utilization of the surface area of the polarizer 10 provided by the embodiments of the disclosure, and increasing the screen-to-body ratio. Meanwhile, the first protective film 11 covers both of the first polarizing portion P1 and the first hollow portion L1, the edge of the first hollow portion L1 can be protected, and the first polarizing portion P1 is prevented from being damaged by the edge of the first hollow portion L1, thereby solving the problem in the related art, that is, the sharp corners and protrusions formed by the processes of excavating and subtracting the polarizer are susceptible to cause damages.

Figure 3:
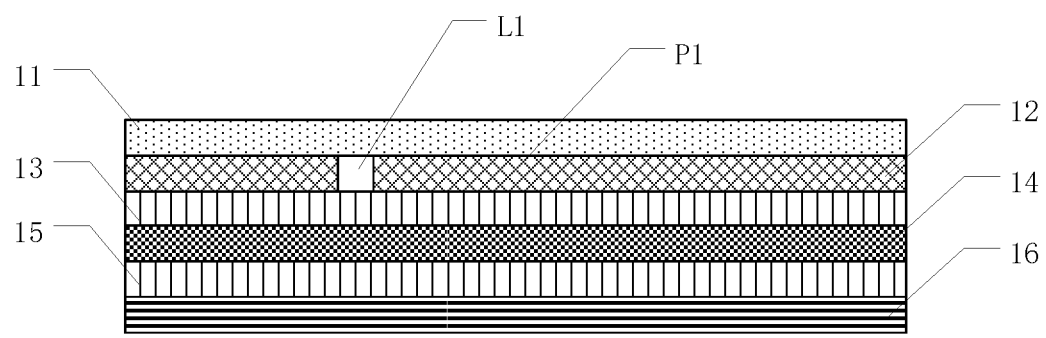
FIG. 3 is a hierarchical schematic diagram showing a polarizer according to another embodiment of the present disclosure.

The embodiments of the present disclosure further provide a polarizer 10. As shown in FIG. 3, the polarizer 10 further includes a quarter-wave plate (λ/4 film) 14 and a second pressure-sensitive adhesive layer 15. The quarter-wave plate 14 is located at a side of the first pressure-sensitive adhesive layer 13 facing away from the first polarizing layer 12. The second pressure-sensitive adhesive layer 15 is located at a side of the quarter-wave plate 14 facing away from the first polarizing layer 12. That is, the second pressure-sensitive adhesive layer 15 is located between the quarter-wave plate 14 and the release film 16.

Figure 4:
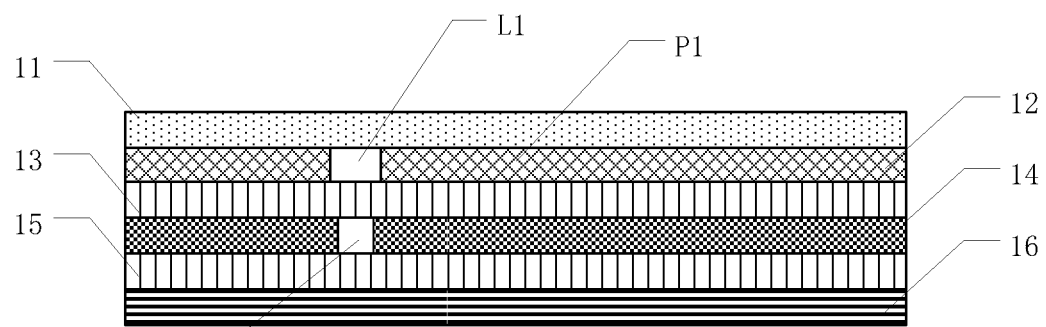
FIG. 4 is a hierarchical schematic diagram showing a polarizer according to still another embodiment of the present disclosure.
Figure 5:
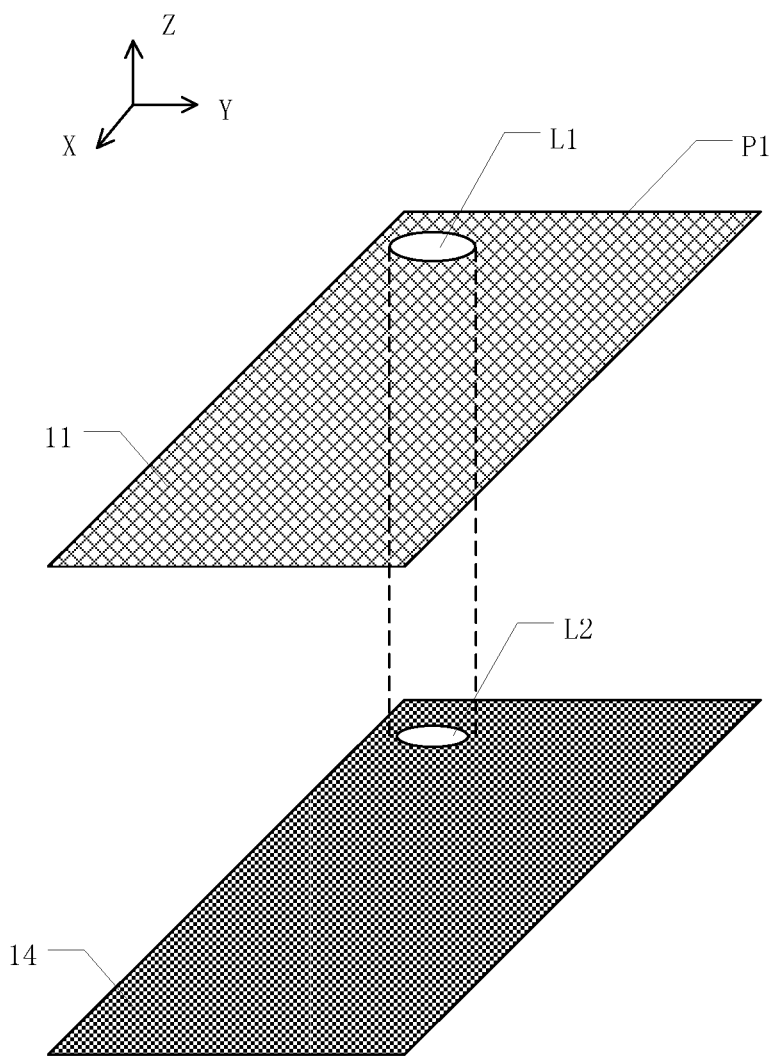
FIG. 5 is an exploded view showing a first polarizing layer and a quarter-wave plate of the polarizer shown in FIG. 4.

The quarter-wave plate 14 can be circularly polarized and can be attached to the organic light-emitting display panel. Further, as shown in FIG. 4, the quarter-wave plate 14 includes a second hollow portion L2 overlapping with the first hollow portion L1. That is, light does not undergo polarization when passing through the first hollow portion L1 and the second hollow portion L2. Referring to FIGS. 4 and 5, in a direction perpendicular to the polarizer 10, that is, in a third direction Z, the first hollow portion L1 overlaps with the second hollow portion L2, and the area of the second hollow portion L2 is smaller than the area of the first hollow portion L1.

Figure 6:
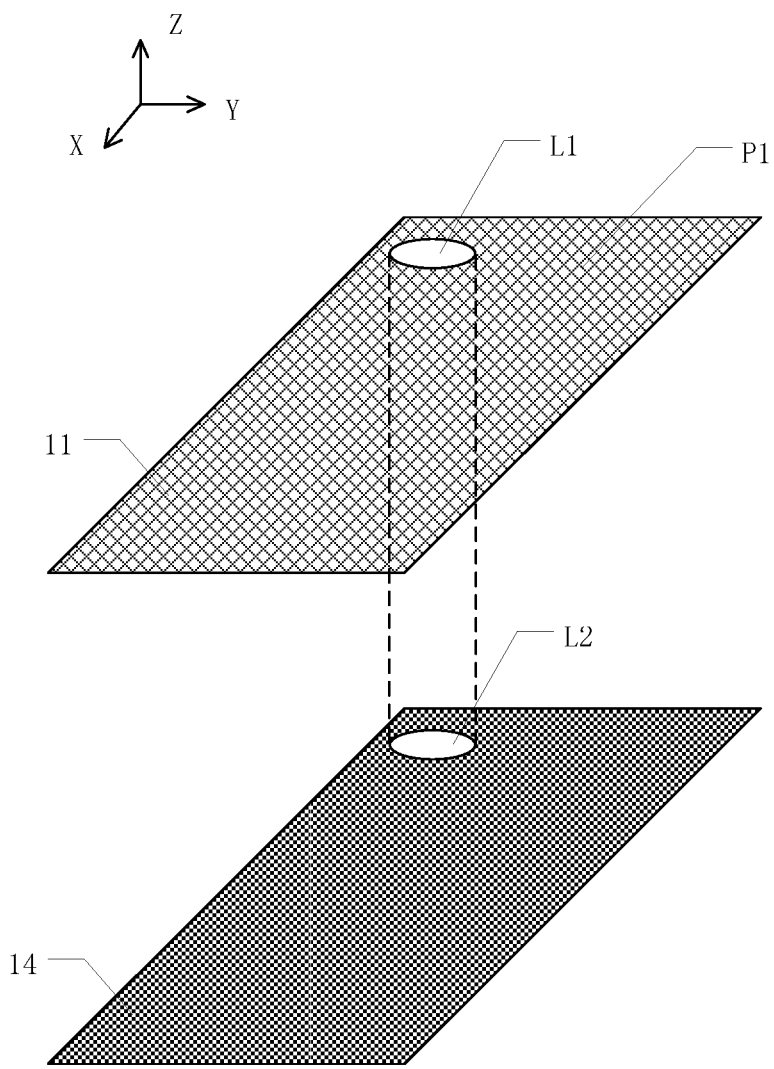
FIG. 6 is an exploded view showing a first polarizing layer and a quarter-wave plate of a polarizer according to another embodiment of the present disclosure.

FIGS. 4 and 5 are side views showing a polarizer 10 according to the embodiments of the present disclosure. In other embodiments of the present disclosure, as shown in FIG. 6, in a direction perpendicular to the polarizer 10, that is, in the third direction Z, the first hollow portion L1 overlaps with the second hollow portion L2, and the area of the second hollow portion L2 is equal to the area of the first hollow portion L1. The release film 16 covers the second hollow portion L2.

Referring to FIG. 5 or 6, in the direction perpendicular to the polarizer 10, that is, in the third direction Z, the second hollow portion L2 is completely covered by the first hollow portion L1. It should be noted that the polarizer 10 provided by the embodiments of the present disclosure includes a quarter-wave plate 14 having the second hollow portion L2, and therefore can be circularly polarized in a region other than the second hollow portion L2 by using a quarter-wave plate. After combining with the polarizing function of the first polarizing portion P1 of the first polarizing layer 12, the polarizer 10 provided in the embodiments of the present disclosure can be used as a polarizer for the organic light-emitting display panel.

The polarizer 10 provided in the embodiments of the present disclosure may be required to manufacture the second hollow portion L2 on the quarter-wave plate 14. Its manufacturing method is similar to the manufacturing method of manufacturing the first polarizing portion P1 and the first hollow portion L1 on the first polarizing layer 12. Firstly, a substrate or an organic film is provided. The second hollow portion L2 is then shielded by using a mask, and a liquid crystal (LC) material is coated on the substrate or the organic film while the liquid crystal material will not be applied to the first hollow portion L1. Next, the substrate or the organic film coated with the liquid crystal material is radiated by light so as to orient the liquid crystal in a specific axial direction. Next, the liquid crystal oriented is cured to form a required liquid crystal polyvinyl alcohol (LC PVA) film layer, and then the quarter-wave plate 14 is formed. Then, the first polarizing layer 12 is attached to the first protective film 11, the first pressure-sensitive adhesive layer 13, the quarter-wave plate 14, the second pressure-sensitive adhesive layer 15, and the release film 16.

With the polarizer 10 according to the embodiments of the present disclosure, since the first hollow portion L1 is disposed in the first polarizing portion P1, the first hollow portion L1 does not polarize the light, so that an image collecting device such as a camera can be disposed in the polarizing region, thereby improving utilization of the surface area of the polarizer 10 provided by the embodiments of the disclosure, and increasing the screen-to-body ratio. Meanwhile, the first protective film 11 covers both of the first polarizing portion P1 and the first hollow portion L1, the edge of the first hollow portion L1 can be protected, and the first polarizing portion P1 is prevented from being damaged by the edge of the first hollow portion L1, thereby solving the problem in the related art, that is, the sharp corners and protrusions formed by the processes of excavating and subtracting the polarizer are susceptible to cause damages.

With the polarizer 10 according to the embodiments of the present disclosure, since the first hollow portion L1 is disposed in the first polarizing portion P1 and the second hollow portion L2 is disposed in the quarter-wave plate 14, the first hollow portion L1 and the second hollow portion L2 do not polarize the light, so that an image collecting device such as a camera can be disposed between the linear polarizing region and the circular polarizing region, thereby improving utilization of the surface area of the polarizer 10 provided by the embodiments of the disclosure, and increas-ing the screen-to-body ratio. Meanwhile, the first protective film 11 covers both of the first polarizing portion P1 and the first hollow portion L1, the edge of the first hollow portion L1 can be protected, and the first polarizing portion P1 is prevented from being damaged by the edge of the first hollow portion L1, thereby solving the problem in the related art, that is, the sharp corners and protrusions formed by the processes of excavating and subtracting the polarizer are susceptible to cause damages.

Figure 7:
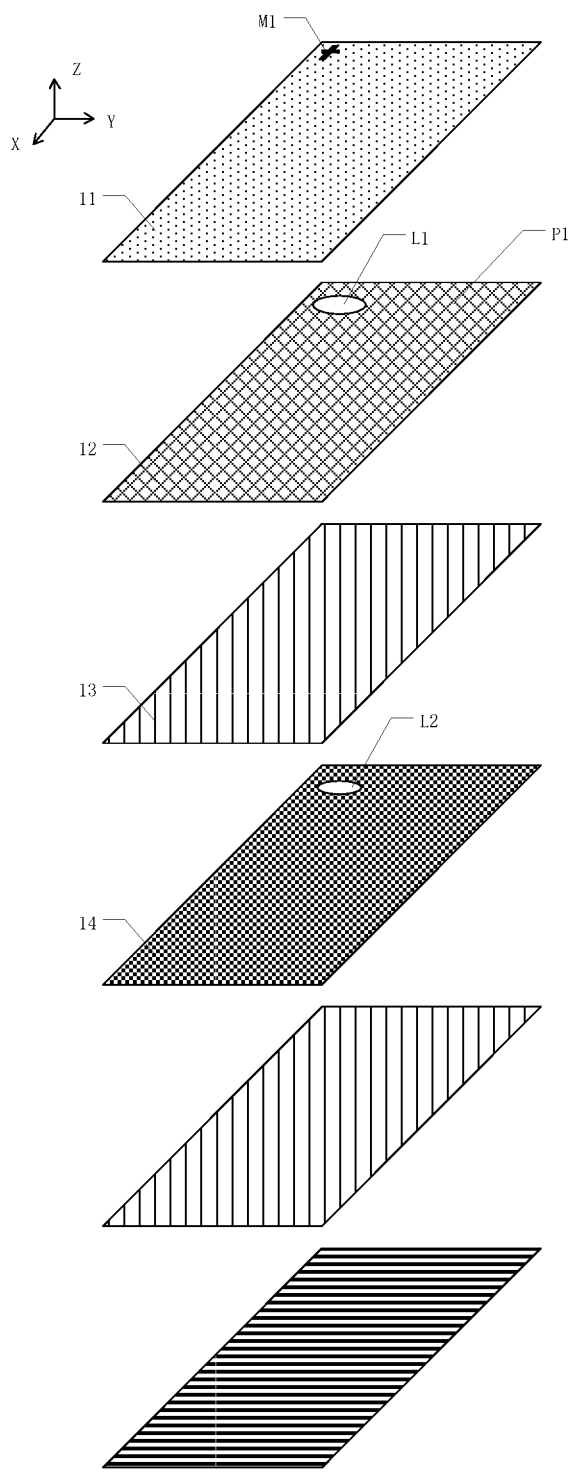
FIG. 7 is an exploded view showing a polarizer according to another embodiment of the present disclosure.

Further, as shown in FIG. 7, the polarizer 10 provided by the embodiments of the present disclosure further includes a first alignment marker M1. The first alignment marker M1 may be located at any layer of the polarizer 10 other than the release film 16, and FIG. 7 shows only one embodiment in which the first alignment marker M1 is located in the first protective film 11. The first alignment marker M1 can be aligned in the attachment of the polarizer 10 in order to facilitate usage of the polarizer 10 provided by the embodiments of the present disclosure.

Figure 8:
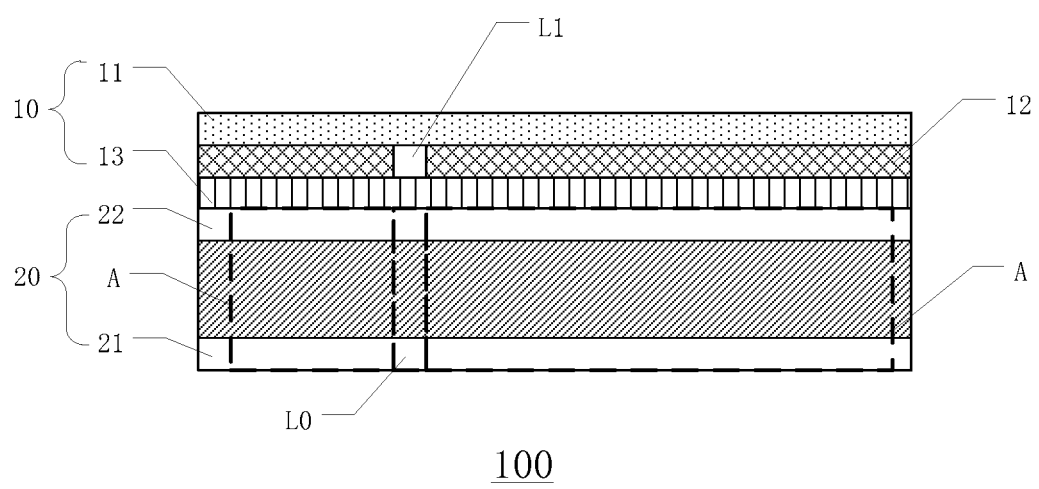
FIG. 8 is a hierarchical schematic diagram showing a display panel according to an embodiment of the present disclosure.
Figure 9:
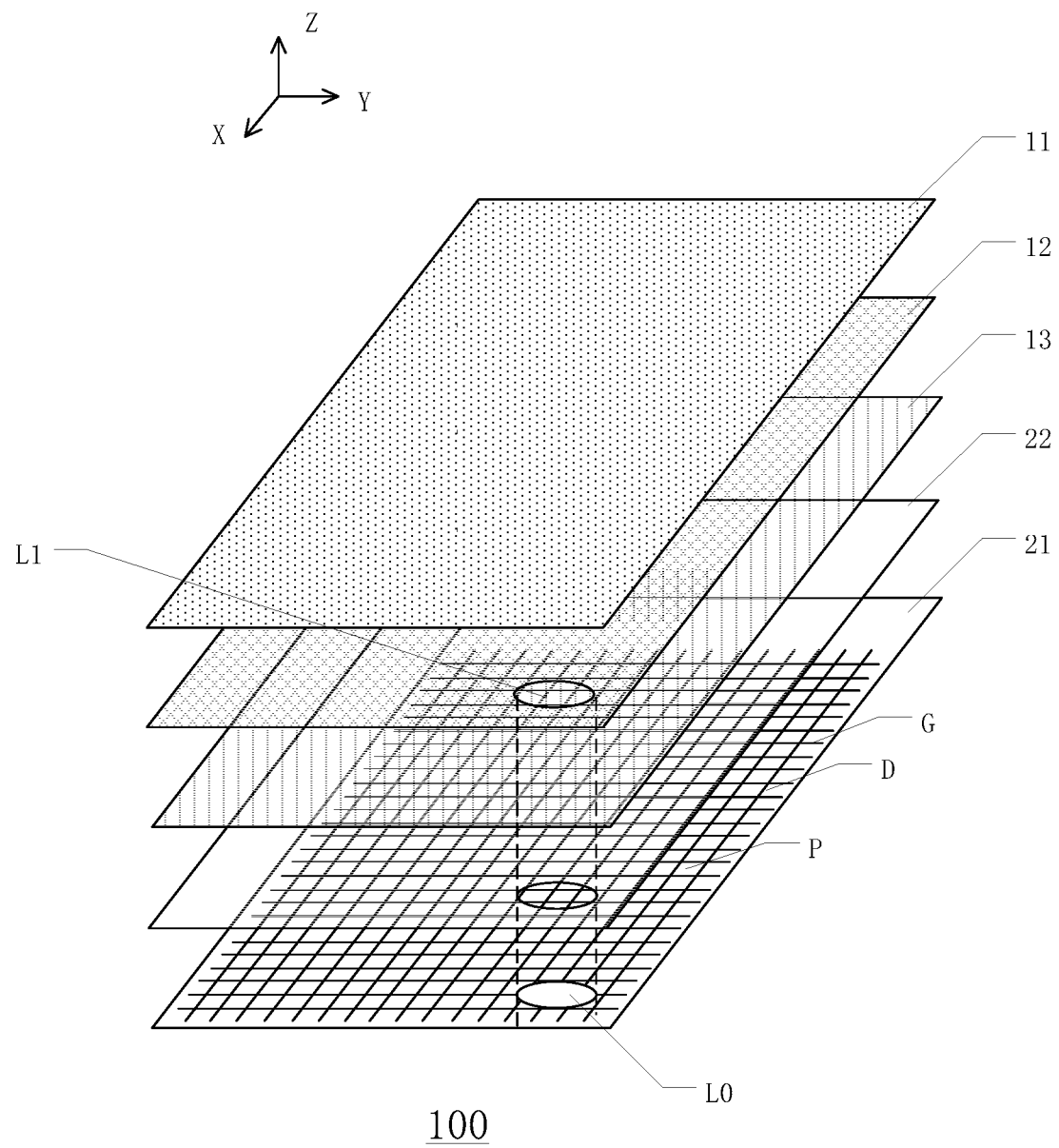
FIG. 9 is an exploded view of the display panel shown in FIG. 8.

The embodiments of the present disclosure further provide a display panel 100. As shown in FIGS. 8 and 9, the display panel 100 includes a display substrate 20 and a polarizer 10.

The display substrate 20 includes a first underlay 21, a second underlay 22, and an intermediate layer between the first underlay 21 and the second underlay 22. The first underlay 21 includes a plurality of gate lines G, a plurality of data lines D, and a plurality of pixel units P. The second underlay 22 is disposed opposite to the first underlay 21. An intermediate layer is provided between the second underlay 22 and the first underlay 21. When the display substrate 20 is a liquid crystal display panel, the intermediate layer includes a driving layer and a liquid crystal layer. The driving layer further includes a gate line G, a data line D, a plurality of transistors, a capacitor, a pixel electrode, and a common electrode. When the display substrate 20 is an organic light-emitting display panel, the intermediate layer includes a driving layer and a light-emitting device layer. The driving layer further includes a gate line G, a data line D, a plurality of transistors, and a capacitor. The light-emitting device layer includes an anode, a luminescent material, and a cathode. The display substrate 20 further includes a hollow region L0 and a display region A surrounding the hollow region L0. The hollow region L0 is not provided with the pixel unit P. That is, the hollow region L0 may be transparent to allow light to pass in the direction perpendicular to the display panel 100, that is, the third direction Z and a direction opposite to the third direction Z. The display region A is disposed surrounding the hollow region L0, and can effectively utilize the region surrounding the hollow region L0 to display, thereby increasing the display area ratio of the display panel 100, and meeting the requirements of the high screen-to-body ratio for the customer.

Referring to FIGS. 8 and 9, the polarizer 10 includes a first protective film 11, a first polarizing layer 12, and a first pressure-sensitive adhesive layer 13. The first polarizing layer 12 includes a first hollow portion L1 and a first polarizing portion P1 surrounding the first hollow portion. The first protective film 11 covers the first hollow portion L1 and the first polarizing portion P1. The first pressure-sensitive adhesive layer 13 is located at a side of the first polarizing layer 12 facing away from the first protective film 11. It should be noted that since the polarizer 10 has been attached to the display substrate 20, the release film of the polarizer 10 has been peeled off. The first hollow portion L1 overlaps with the hollow region L0. That is, in a direction perpendicular to the display panel 100, such as the third direction Z, the first hollow portion L1 overlaps with the hollow region L0.

With the display panel 100 according to the embodiments of the present disclosure, since the first hollow portion L1 is disposed in the first polarizing portion P1 of the polarizer 10 included in the display panel 100, the first hollow portion L1 does not polarize the light, and since the display substrate 20 included in the display panel 100 is provided with the hollow region L0, an image collecting device such as a camera can be disposed in the first hollow portion L1 and the hollow region L0, thereby improving utilization of the surface area of the display panel 100 provided by the embodiments of the disclosure, and increasing the screen-to-body ratio. Meanwhile, the polarizer 10 is integrally attached to the display substrate 20 to form a display panel, which avoids the problem in the related art, that is, the polarizer and the display substrate are attached and then the middle region in the display panel is excavated to achieve light transmission so that the display device and the polarizer may be damaged.

Further, referring to FIGS. 8 and 9, the area of the first hollow portion L1 is equal to the area of the hollow portion L0. It should be noted that FIGS. 8 and 9 show only one embodiment of the display panel 100 provided by the present disclosure. In other embodiments provided by the present disclosure, as shown in FIG. 10, the area of the hollow region L0 is smaller than the area of the first hollow portion L1.

Figure 10:
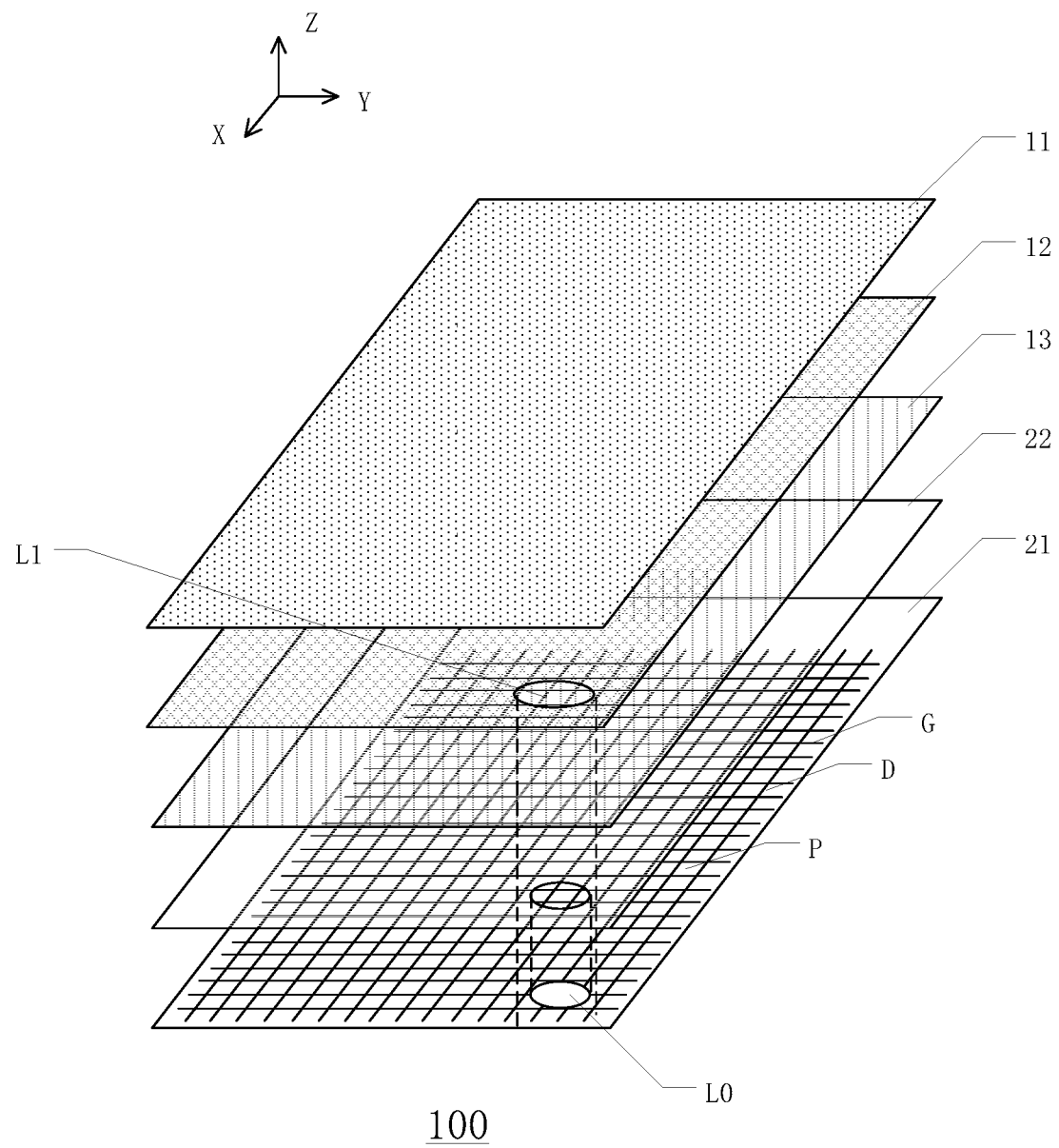
FIG. 10 is an exploded view showing a display panel according to another embodiment of the present disclosure.

Further, referring to FIGS. 8-10, in a direction perpendicular to the display panel 100, such as the third direction Z, the hollow region L0 is completely covered by the first hollow portion L1.

Figure 11:
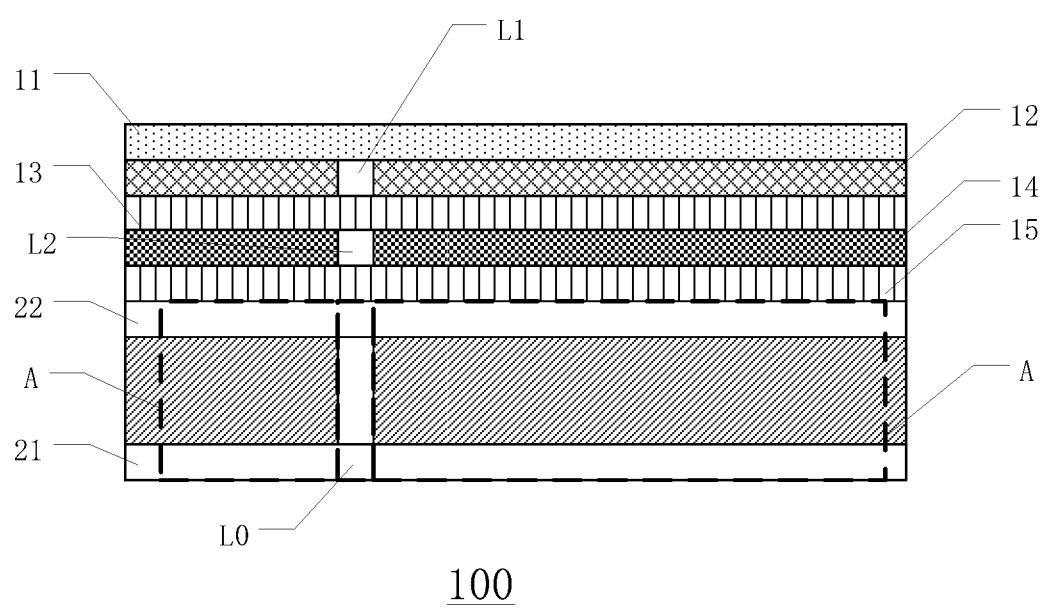
FIG. 11 is a hierarchical schematic diagram showing a display panel according to another embodiment of the present disclosure.
Figure 12:
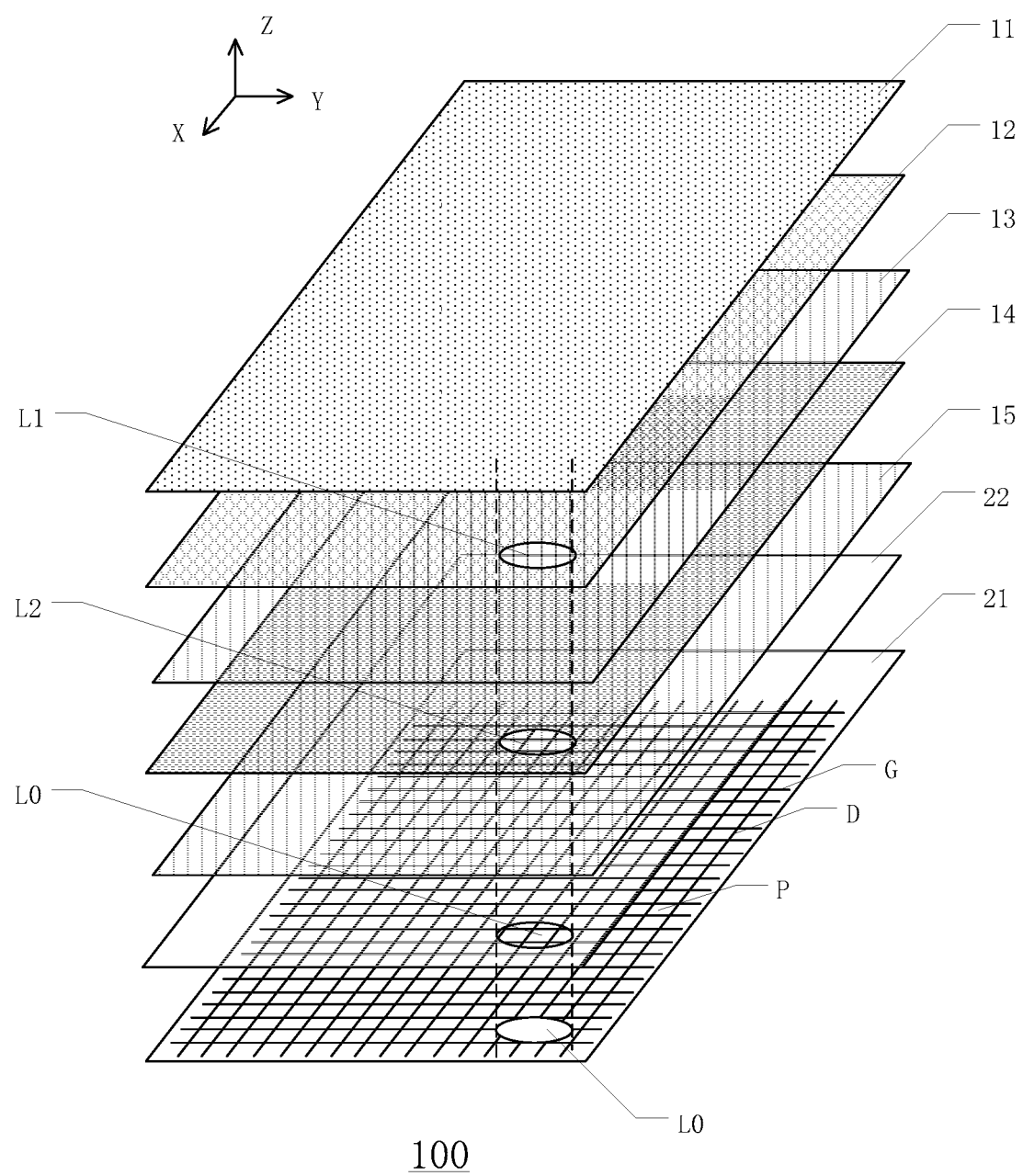
FIG. 12 is an exploded view of the display panel shown in FIG. 11.

The embodiments of the present disclosure further provide a display panel 100. As shown in FIGS. 11 and 12, the polarizer 10 of the display panel 100 further includes a quarter-wave plate (λ/4 film) 14 and a second pressure-sensitive adhesive layer 15. The quarter-wave plate 14 is located at a side of the first pressure-sensitive adhesive layer 13 facing away from the first polarizing layer 12. The second pressure-sensitive adhesive layer 15 is located at a side of the quarter-wave plate 14 facing away from the first polarizing layer 12. That is, the second pressure-sensitive adhesive layer 15 is located between the quarter-wave plate 14 and the second underlay 22. It should be noted that since the polarizer 10 has been attached to the display substrate 20 to form the display panel 100, the release film of the polarizer 10 has been peeled off.

The quarter-wave plate 14 can be circularly polarized and can be attached to the organic light-emitting display panel. That is, the intermediate layer between the first underlay 21 and the second underlay 22 includes a light-emitting device including an anode, a light-emitting material, and a cathode.

Referring to FIGS. 11 and 12, the quarter-wave plate 14 includes a second hollow portion L2. In a direction perpendicular to the polarizer 10, such as the third direction Z, the first hollow portion L1 overlaps with the second hollow portion L2. That is, light does not undergo polarization when passing through the first hollow portion L1 and the second hollow portion L2. Further, as shown in FIGS. 11 and 12, the area of the second hollow portion L2 is equal to the area of the first hollow portion L1. It should be noted that FIGS. 11 and 12 show only one embodiment of the display panel 100 according to the embodiments of the present disclosure. In other embodiments provided by the present disclosure, the area of the second hollow portion L2 can be smaller than the area of first hollow portion L1.

Referring to FIGS. 11 and 12, in the direction perpendicular to the polarizer 10, e.g., in the third direction Z, the second hollow portion L2 is completely covered by the first hollow portion L1.

Figure 13:
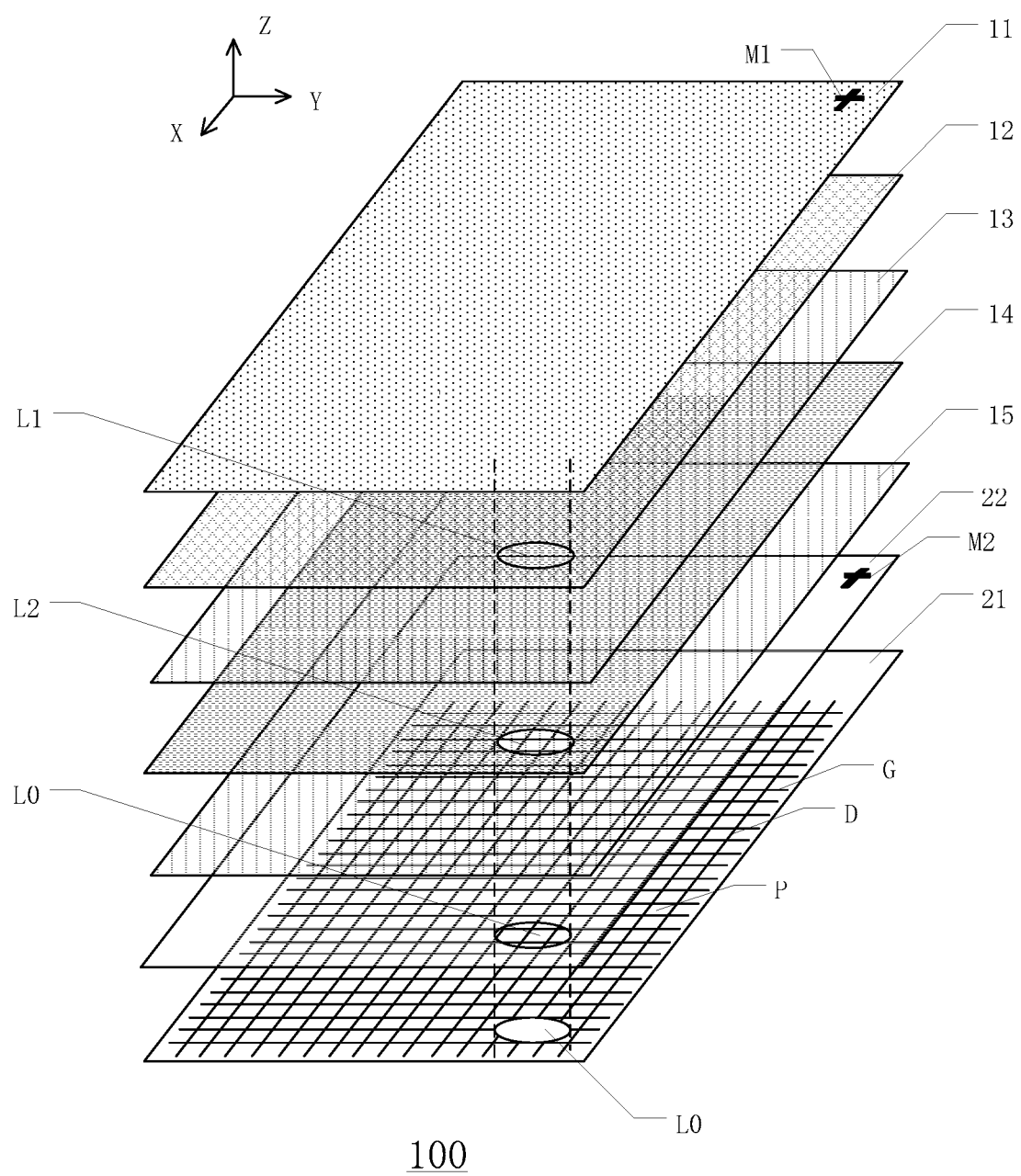
FIG. 13 is an exploded view showing a display panel according to yet still another embodiment of the present disclosure.

Further, as shown in FIG. 13, the polarizer 10 further includes a first alignment marker M1, and the display substrate 20 includes a second alignment marker M2. The first alignment marker M1 may be located in any film layer of the first protective film 11, the first polarizing layer 12, the first pressure-sensitive adhesive layer 13, the quarter-wave plate 14, and the second pressure-sensitive adhesive layer 15 of the polarizer 10. The second alignment marker M2 may be located in any film layer of the first underlay 21, the second underlay 22, and the intermediate layer between the first underlay 21 and the second underlay 22. The first alignment marker M1 and the second alignment marker M2 are embedded to each other or overlap with each other. The first alignment marker M1 and the second alignment marker M2 are configured to align in the process of attaching the polarizer 10 to the display substrate 20, so that the position at which the polarizer 10 is attached to the display substrate 20 is more accurate, and thus the yield of the display panel 100 in the embodiments of the present disclosure is improved.

Figure 14:
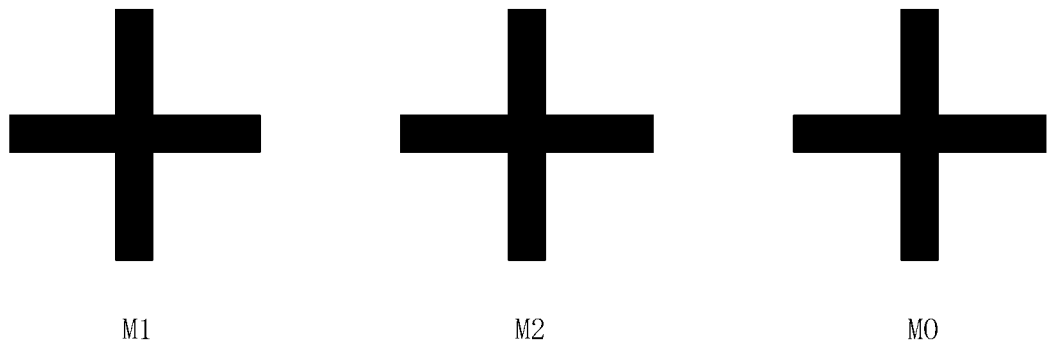
FIG. 14 is a schematic diagram showing a first alignment marker and a second alignment marker of a display panel according to an embodiment of the present disclosure.

FIG. 14 shows one manner in which the first alignment marker M1 and the second alignment marker M2 are designed overlapping with each other. As shown in FIG. 14, the first alignment marker M1 and the second alignment marker M2 are both cross-shaped markers having the same size and shape. A cross-shaped marker as shown by a combination marker MO is displayed after the first alignment marker M1 and the second alignment marker M2 are aligned. If the first registration marker M1 and the second alignment marker M2 are not aligned accurately during the attaching process, the cross marker shown by the combination marker MO is not finally presented. That is, if the first alignment marker M1 and the second alignment marker M2 are not aligned accurately during the attaching process, the first alignment marker M1 will not completely cover the second alignment marker M2.

Figure 15:
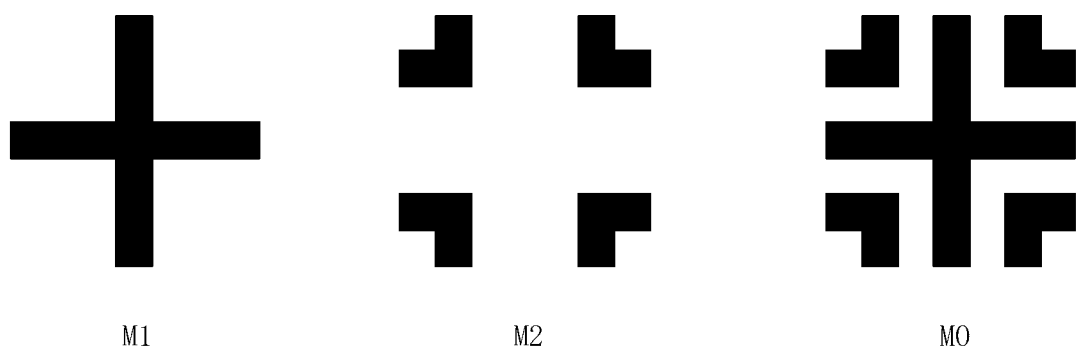
FIG. 15 is a schematic diagram showing a first alignment marker and a second alignment marker of a display panel according to another embodiment of the present disclosure.

FIG. 15 shows one manner in which the first alignment marker M1 and the second alignment marker M2 are embedded to each other. As shown in FIG. 15, the first alignment marker M1 is a cross marker, and the second alignment marker M2 is a marker having four corners to be embedded to the first alignment marker M1. The marker as shown by the combination marker MO is displayed after the first alignment marker M1 and the second alignment marker M2 are aligned. If the first alignment marker M1 and the second alignment marker M2 are not aligned accurately during the attaching process, the cross marker shown by the combination marker MO is not finally presented. That is, if the first alignment marker M1 and the second alignment marker M2 are not aligned accurately during the attaching process, the distances between the ends of four ends of the first alignment marker M1 and the adjacent corners are different.

It should be noted that FIGS. 14 and 15 show only one shape of the first alignment marker M1 and the second alignment marker M2. In other embodiments of the present disclosure, the first alignment marker M1 and the second alignment marker M2 may also be other shapes such as a diamond shape, a circular shape, a triangular shape or an irregular shape.

The embodiments of the present disclosure further provide a display panel 100. As shown in FIG. 11, the first underlay 21 covers the hollow region L0, and the second underlay 22 covers the hollow region L0. That is, the first underlay 21 and the second underlay 22 are not excavated at the hollow region L0 of the display panel 100. It is only necessary to omit a part of hierarchal layers of the intermediate layer between the first underlay 21 and the second underlay 22, so that the light transmittance of the hollow region L0 can reach 45% or more.

With the display panel 100 provided by the embodiments of the present disclosure, since the first underlay 21 and the second underlay 22 are not excavated at the hollow region L0, and the first protective film 11 completely covers the first hollow portion L1 of the first polarizing layer 12, the through holes may not be formed in the hollow region L0 and the first hollow portion L1, so that the problem that the polarizer 10 and the display substrate 20 are damaged by abrasion generated from the edges is avoided.

Figure 16:
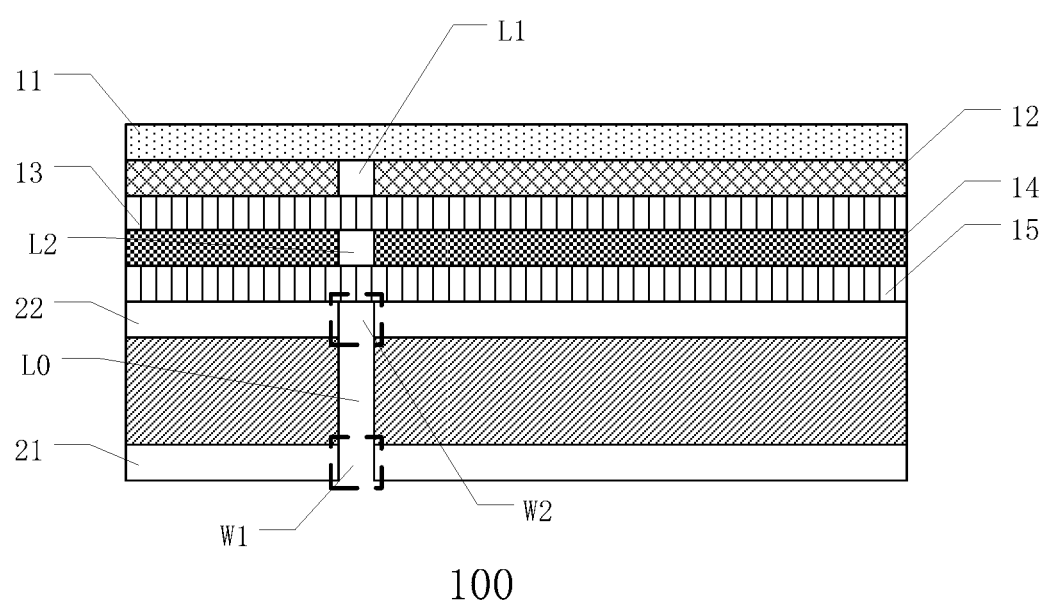
FIG. 16 is a hierarchical schematic diagram showing a display panel according to still another embodiment of the present disclosure.

The embodiments of the present disclosure further provide a display panel 100. As shown in FIG. 16, the first underlay 21 includes a first opening portion W1, and the second underlay 22 includes a second opening portion W2. The first opening portion W1 and the second opening portion W2 are located in the hollow region L0, and no intermediate layer is disposed between the first opening portion W1 and the second opening portion W2. That is, the first underlay 21 and the second underlay 22 are not excavated in the hollow region L0 of the display panel 100, so that light transmittance of the hollow region L0 can reach 95% or more.

With the display panel 100 provided by the embodiments of the present disclosure, since the first underlay 21 and the second underlay 22 at the hollow region L0 are excavated, and the first protective film 11 is arranged to completely cover the first hollow portion L1 of the first polarizing layer 12, light transmittance in the hollow region L0 can reach 95% or more, and more light and sound can be collected, and the accommodation space can be provided for the collecting device. Meanwhile, the first protective film completely covers the first hollow portion L1, the first hollow portion L1 will not have a through hole, and the problem that the polarizer 10 and the display substrate 20 are damaged by abrasion generated at a side of the polarizer 10 facing away from the display substrate 20 is avoided.

Figure 17:
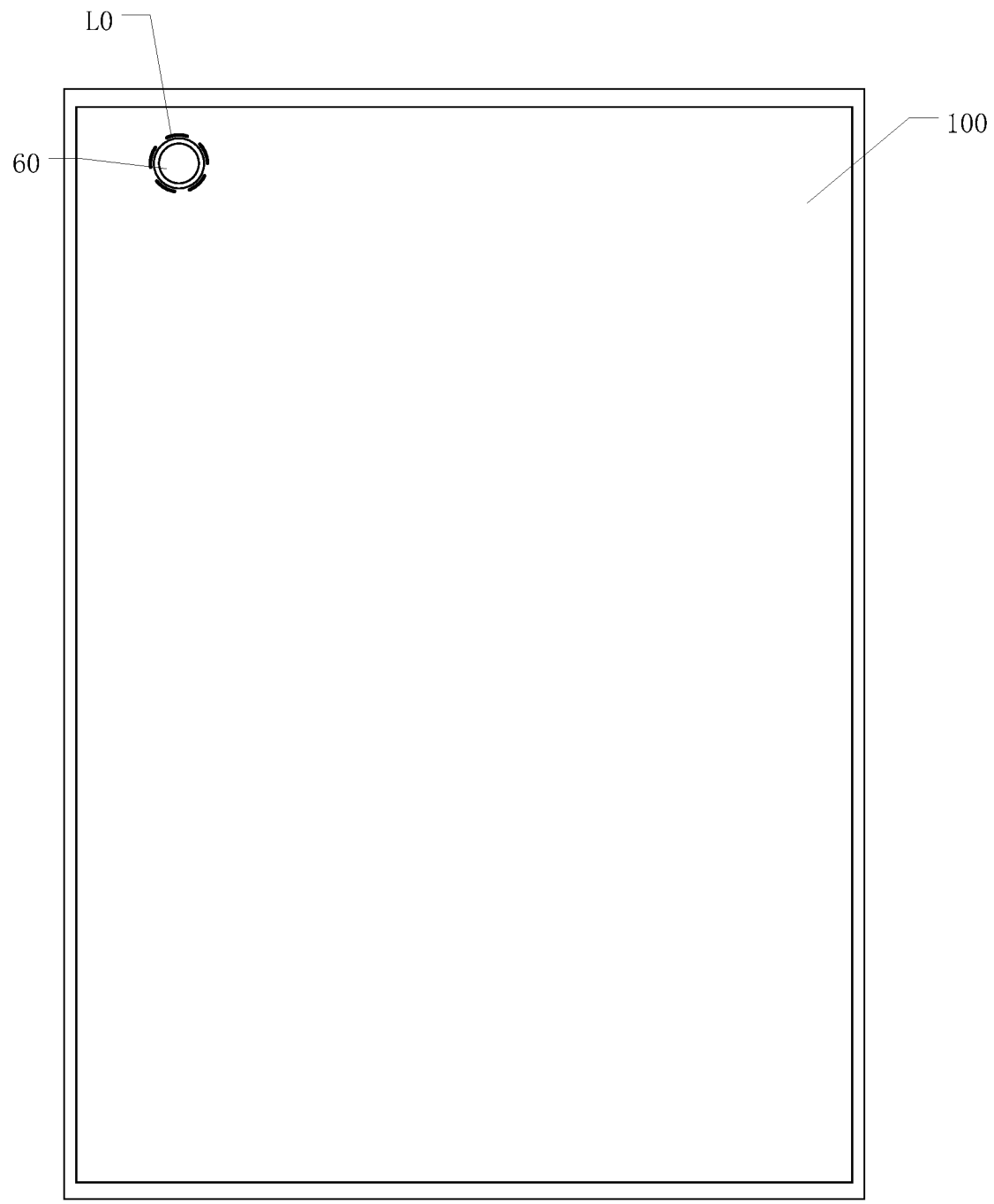
FIG. 17 is a top plan view showing a display device according to an embodiment of the present disclosure.
Figure 18:
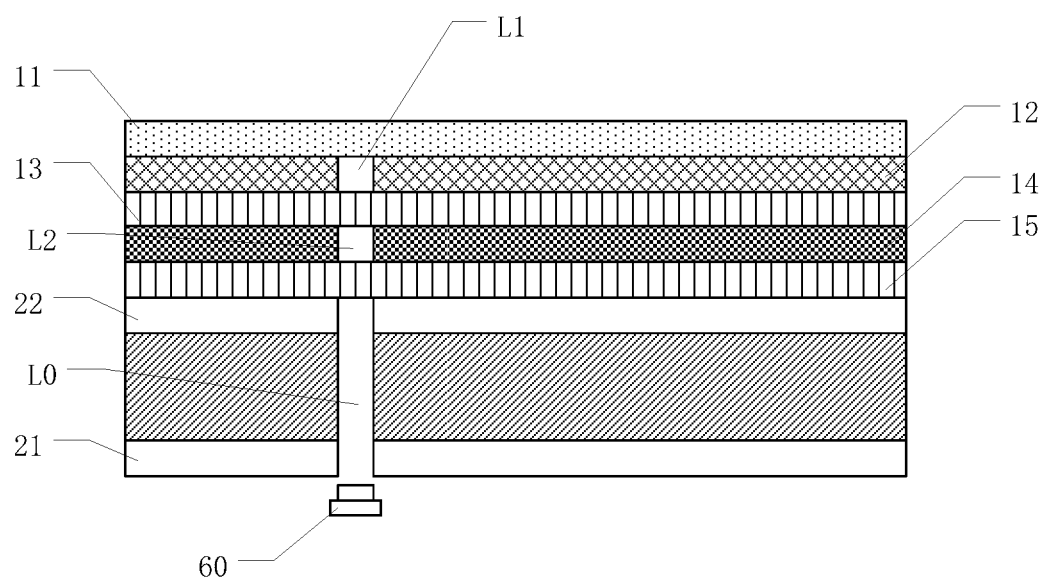
FIG. 18 is a hierarchical schematic diagram showing a display device according to an embodiment of the present disclosure.

The embodiments of the present disclosure further provide a display device 500. As shown in FIGS. 17 and 18, the display device 500 includes the display panel 10 provided by the embodiments of the present disclosure. The display device 500 further includes an image collecting device 60 or an audio device 60. At least one of the image collecting device 60 and the audio device 60 is located in the hollow region L0. The image collecting device 60 may be a camera, and an image collecting device which can perform photos taking, photographing, image collection, and recognition. The audio device 60 may also be a receiver, a sounder, and a device that can transmit sound by vibration.

It should be noted that, an example of the organic light-emitting display device 500 is shown in FIGS. 17 and 18. The shape of the organic light-emitting display device 500 is not limited to the shape or the usage state shown in FIGS. 17 and 18, and can be a rectangle or a non-rectangular shape. The organic light-emitting display device 500 may have no border at all, and may have at least one border.

The device according to the embodiments described above are merely illustrative, in which the units illustrated as separate components may be or may not be physically separated, and the components displayed as a unit may be or may not be a physical unit, i.e., they may be located in one place, or may be distributed in at least two network elements. Some or all of the devices may be selected according to actual requirements in order to achieve the purpose of the solutions of the embodiments of the present disclosure.

What is claimed is:

1. A display panel, comprising:
a display substrate and a polarizer;
wherein the display substrate comprises:
a first underlay comprising a plurality of gate lines, a plurality of data lines, and a plurality of pixel units; and
a second underlay disposed opposite to the first underlay,
wherein the display substrate has a hollow region and a display region surrounding the hollow region, and none of the plurality of pixel units is arranged in the hollow region,
wherein the polarizer comprises:
a first polarizing layer comprising a first hollow portion and a first polarizing portion surrounding the first hollow portion;
a first protective film covering the first hollow portion and the first polarizing portion; and
a first pressure-sensitive adhesive layer located at a side of the first polarizing layer facing away from the first protective film, and
wherein the first hollow portion overlaps with the hollow region, and the first hollow portion is located in the first polarizing layer.

2. The display panel according to claim 1, wherein the hollow region has an area smaller than or equal to an area of the first hollow portion.

3. The display panel according to claim 2, wherein the hollow region is completely covered by the first hollow portion.

4. The display panel according to claim 1, wherein the polarizer comprises a quarter-wave plate, and the quarter-wave plate is located at a side of the first pressure-sensitive adhesive layer facing away from the first polarizing layer.

5. The display panel according to claim 4, wherein the quarter-wave plate comprises a second hollow portion overlapping with the first hollow portion.

6. The display panel according to claim 5, wherein the second hollow portion has an area smaller than or equal to an area of the first hollow portion.

7. The display panel according to claim 6, wherein the second hollow portion is completely covered by the first hollow portion.

8. The display panel according to claim 4, wherein the polarizer further comprises a second pressure-sensitive adhesive layer located between the quarter-wave plate and the second underlay.

9. The display panel according to claim 1, wherein the polarizer further comprises a first alignment mark;
the display substrate further comprises a second alignment mark; and
the first alignment marker and the second alignment marker are embedded into each other or are overlapped with each other.

10. The display panel according to claim 1, wherein the first underlay covers the hollow region, and the second underlay covers the hollow region.

11. The display panel according to claim 1, wherein the first underlay comprises a first opening portion located in the hollow region, and the second underlay comprises a second opening portion located in the hollow region.

12. A display device, comprising:
a display panel, comprising:
a display substrate and a polarizer;

wherein the display substrate comprises:
a first underlay comprising a plurality of gate lines, a plurality of data lines, and a plurality of pixel units; and
a second underlay disposed opposite to the first underlay,
wherein the display substrate has a hollow region and a display region surrounding the hollow region, and none of the plurality of pixel units is arranged in the hollow region,
wherein the polarizer comprises:
a first polarizing layer comprising a first hollow portion and a first polarizing portion surrounding the first hollow portion;
a first protective film covering the first hollow portion and the first polarizing portion; and
a first pressure-sensitive adhesive layer located at a side of the first polarizing layer facing away from the first protective film, and
wherein the first hollow portion overlaps with the hollow region, and the first hollow portion is located in the first polarizing layer.

13. The display device according to claim 12, further comprising an image collecting device or a sounding device, wherein at least one of the image collecting device and the sounding device is located in the hollow region.

* * * * *